(12) United States Patent
Kawahara et al.

(10) Patent No.: US 10,204,767 B2
(45) Date of Patent: Feb. 12, 2019

(54) PLASMA SOURCE FOR A PLASMA CVD APPARATUS AND A MANUFACTURING METHOD OF AN ARTICLE USING THE PLASMA SOURCE

(71) Applicant: Asahi Glass Company, Limited, Tokyo (JP)

(72) Inventors: Hirotomo Kawahara, Tokyo (JP); Nobutaka Aomine, Tokyo (JP); Kazunobu Maeshige, Tokyo (JP); Yuki Aoshima, Tokyo (JP); Hiroshi Hanekawa, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 15/886,486

(22) Filed: Feb. 1, 2018

(65) Prior Publication Data

US 2018/0158655 A1 Jun. 7, 2018

Related U.S. Application Data

(60) Division of application No. 14/699,249, which is a continuation of application No. PCT/JP2013/078735, filed on Oct. 23, 2013, now Pat. No. 9,922,805.

(30) Foreign Application Priority Data

Nov. 2, 2012 (JP) ................................. 2012-242663

(51) Int. Cl.
*H01J 37/32* (2006.01)
*H05H 1/46* (2006.01)
(Continued)

(52) U.S. Cl.
CPC ...... *H01J 37/32568* (2013.01); *C23C 16/402* (2013.01); *C23C 16/50* (2013.01);
(Continued)

(58) Field of Classification Search
CPC .......................... C23C 16/503; H01J 37/32568
See application file for complete search history.

(56) References Cited

U.S. PATENT DOCUMENTS 5,057,185 A 10/1991 Thomas, III et al.
2002/0007793 A1 1/2002 Sakai et al.
(Continued)

FOREIGN PATENT DOCUMENTS

EP 2 256 782 A1 12/2010
GB 2466836 A 7/2010
(Continued)

OTHER PUBLICATIONS

International Search Report dated Jan. 21, 2014 in PCT/JP2013/078735, filed Oct. 23, 2013.

*Primary Examiner* — Joel G Horning
(74) *Attorney, Agent, or Firm* — Oblon, McClelland, Maier & Neustadt, L.L.P.

(57) ABSTRACT

A plasma source for a plasma CVD apparatus that includes an electrode group including four electrodes, which are a first electrode, a second electrode, a third electrode and a fourth electrode arranged in a row. The electrode group is connected to at least one AC power supply. A voltage supplied to two of the four electrodes is shifted in phase from a voltage supplied to the remaining two electrodes. A space to which a source gas is supplied is provided between the adjacent electrodes, and voltages applied to at least one set among the adjacent two electrodes are in the same phase.

20 Claims, 9 Drawing Sheets

(51) Int. Cl.
*C23C 16/40* (2006.01)
*C23C 16/50* (2006.01)
*C23C 16/505* (2006.01)

(52) U.S. Cl.
CPC ........ *C23C 16/505* (2013.01); *H01J 37/3244* (2013.01); *H01J 37/32091* (2013.01); *H01J 37/32577* (2013.01); *H05H 1/46* (2013.01); *H01J 2237/3321* (2013.01); *H05H 2001/4675* (2013.01); *H05H 2001/4682* (2013.01)

(56) References Cited

U.S. PATENT DOCUMENTS

| | | |
|---|---|---|
| 2006/0177599 A1 | 8/2006 | Madocks |
| 2010/0028238 A1 | 2/2010 | Maschwitz |
| 2010/0297361 A1 | 11/2010 | Morrison et al. |
| 2012/0001549 A1 | 1/2012 | Ellingboe et al. |
| 2013/0140984 A1 | 6/2013 | Hirayama et al. |
| 2014/0042123 A1 | 2/2014 | Hirayama |

FOREIGN PATENT DOCUMENTS

| | | |
|---|---|---|
| JP | 2001-338885 A | 12/2001 |
| JP | 2008-251682 A | 10/2008 |
| JP | 2009-534797 A | 9/2009 |
| JP | 2011-530155 A | 12/2011 |
| WO | WO 2012/00852 A1 | 1/2012 |
| WO | WO 2013/124898 A1 | 8/2013 |

PLASMA SOURCE FOR A PLASMA CVD APPARATUS AND A MANUFACTURING METHOD OF AN ARTICLE USING THE PLASMA SOURCE

CROSS-REFERENCE TO RELATED APPLICATIONS

The present application is a divisional of U.S. application Ser. No. 14/699,249, filed Apr. 29, 2015, which is a continuation application filed under 35 U.S.C. 111(a) claiming benefit under 35 U.S.C. 120 and 365(c) of PCT International Application No. PCT/JP2013/078735 filed on Oct. 23, 2013, designating the U.S., which is based on and claims the benefit of priority to Japanese Patent Application No. 2012-242663 filed on Nov. 2, 2012. The entire contents of each of the foregoing applications are incorporated herein by reference.

BACKGROUND

Technical Field

The present invention relates to a plasma source for a plasma CVD apparatus and a manufacturing method of an article using the plasma source.

Description of Related Art

A plasma-enhanced chemical vapor deposition (CVD) technique (Plasma-enhanced chemical vapor deposition: PECVD) is a kind of a chemical vapor deposition (CVD) technique that can deposit a film of various materials on a processing surface by using plasma. The plasma CVD technique is widely used for manufacturing, for example, semiconductor elements.

A plasma-enhanced chemical vapor deposition (CVD) apparatus used for such a plasma CVD technique is equipped with a plasma source that generates plasma. Normally, the plasma source includes a pair of electrodes connected to a high-frequency AC power supply with a frequency such as, for example, 13.56 MHz, and when a discharge is started between the electrodes by the high-frequency AC power supply, plasma is formed between the electrodes. In this state, when a source gas is supplied into the plasma, atoms and/or molecules of the source gas are exited and made to be chemically active, and, thereby, a chemical reaction occurs at a surface to be processed, which permits a film of an object substance being deposited on the surface to be processed.

Recently, in order to permit a large-area film deposition, a plasma source equipped with a low-frequency AC power supply of, for example, the order of kHz, instead of the high-frequency AC power supply, has also been developed. Japanese Translation of PCT International Application Publication No. 2011-530155 discloses that, in a case where such a plasma source is used, plasma having a sufficient length can be provided stably.

As described above, a plasma source that can stably provide plasma having a sufficient length is disclosed in the above-mentioned patent document.

However, in the plasma source of the structure such as disclosed in the above-mentioned patent document, the plasma density of the plasma generated in the vicinity of the electrodes is not sufficient. Accordingly, the reactivity of the source gas supplied to a plasma area in the vicinity of the electrodes becomes low, and there may be a case where a film cannot be deposited on the surface to be processed at a sufficient film-deposition rate.

SUMMARY

It is an object of the present invention to provide a plasma source that can increase the plasma density of the plasma generated in the plasma source for a plasma CVD apparatus.

In order to achieve the above-mentioned object, there is provided according to one aspect of the present invention a plasma source for a plasma CVD apparatus according to a first embodiment of the invention including an electrode group including four electrodes, which are a first electrode, a second electrode, a third electrode and a fourth electrode that are arranged in a row in that order, wherein the electrode group is connected to at least one AC power supply; a voltage supplied to two of the four electrodes is shifted in phase from a voltage supplied to the remaining two electrodes; spaces to which a source gas is supplied are provided between the adjacent electrodes; and voltages applied to at least one set among the adjacent two electrodes are in the same phase.

There is provided according to another aspect of the present invention a manufacturing method of an article including: a step of arranging a processing object in a plasma CVD apparatus equipped with an electrode group including four electrodes, which are a first electrode, a second electrode, a third electrode and a fourth electrode arranged in a row in that order; a step of supplying a source gas for film deposition from at least one interval between the adjacent electrodes in the electrode group; a first voltage applying step of applying a negative voltage to the first electrode and the second electrode, which is adjacent to the first electrode, and applying a positive voltage to the third electrode and the fourth electrode, which is adjacent to the third electrode; and a second voltage applying step of applying a positive voltage to the first electrode and the second electrode and applying a negative voltage to the third electrode and the fourth electrode, wherein an article is manufactured by applying a film deposition on the processing object by alternately performing the first voltage applying step and the second voltage applying step at every lapse of a predetermined time.

There is provided according to a further aspect of the present invention a manufacturing method of an article, including: a step of arranging a processing object in a plasma CVD apparatus equipped with an electrode group including four electrodes, which are a first electrode, a second electrode, a third electrode and a fourth electrode arranged in a row in that order; a step of supplying a source gas for film deposition from at least one interval between the adjacent electrodes in the electrode group; a first voltage applying step of applying a negative voltage to the first electrode and the fourth electrode and applying a positive voltage to the second electrode and the third electrode; and a second voltage applying step of applying a positive voltage to the first electrode and the fourth electrode and applying a negative voltage to the second electrode and the third electrode, wherein an article is manufactured by applying a film deposition on the processing object by alternately performing the first voltage applying step and the second voltage applying step at every lapse of a predetermined time.

Other objects, features and advantages of the present invention will become more apparent from the following detailed description when read in conjunction with the accompanied drawings.

DETAILED DESCRIPTION

A description is given below, with reference to the drawings, of the present invention.

(Regarding a Conventional Plasma Source for a Plasma CVD Apparatus)

Figure 1:
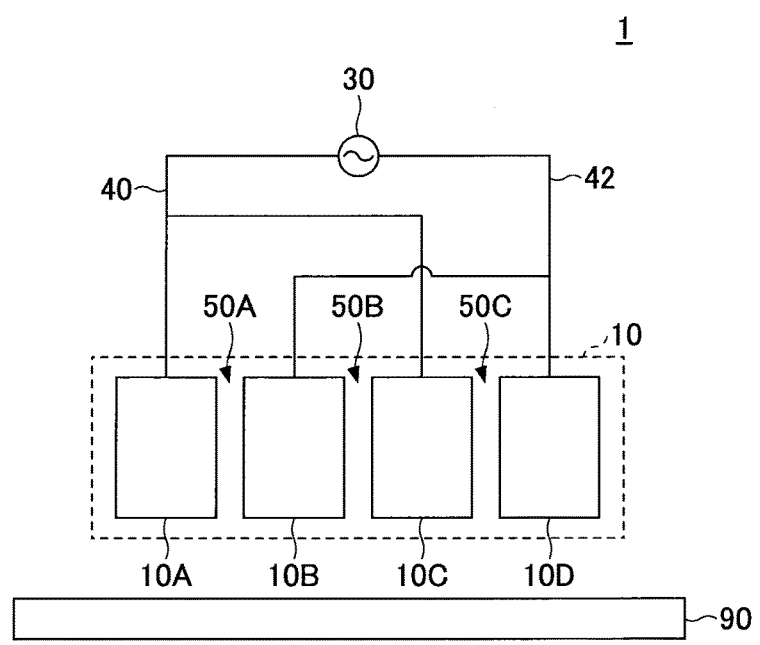
FIG. 1 is a diagram roughly illustrating a configuration of a conventional plasma source for a plasma CVD apparatus.
Figure 2:
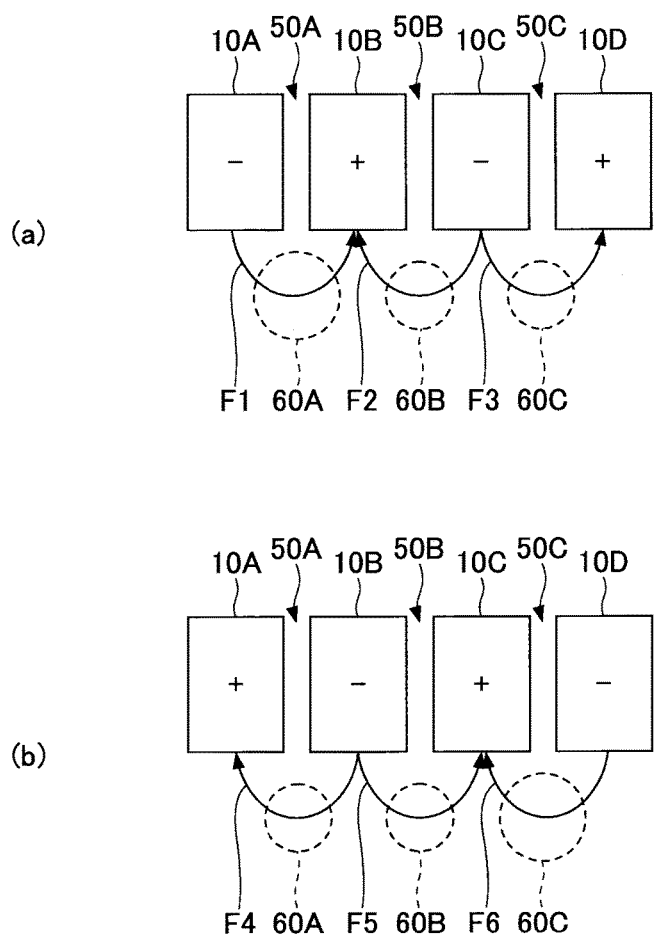
FIGS. 2(a)-(b) are diagrams for explaining a periodical polarity change of each electrode constituting an electrode group when using the conventional plasma source.

For the better understanding of the features of the present invention, first, a brief explanation is given, with reference to FIG. 1 and FIG. 2, of a basic configuration and an operation of a conventional plasma source for a plasma CVD apparatus.

FIG. 1 roughly illustrates a basic configuration of a conventional plasma source. Additionally, FIG. 2 illustrates a schematic diagram illustrating a polarity change of each electrode at a certain time in the conventional plasma source by associating with a plasma density.

As illustrated in FIG. 1, the conventional plasma source 1 is equipped with an electrode group 10 and an AC power supply 30. The electrode group 10 is constituted by arranging a plurality of electrodes in one row. For example, in the example of FIG. 1, the electrode group 10 is constituted by four electrodes that are a first electrode 10A, a second electrode 10B, a third electrode 10C and a fourth electrode 10D.

Each of the electrodes 10A-10D constituting the electrode group is connected with the AC power supply 30. The AC power supply 30 has a wiring 40 for a first polarity and a wiring 42 for a second polarity that is opposite to the first polarity. The wiring 40 for the first polarity is connected to the first electrode 10A and the third electrode 10C. The wiring 42 for the second electrode is connected to the second electrode 10B and the fourth electrode 10D.

A space 50 for supplying the source gas is famed between the adjacent electrodes 10A-10D. That is, a first space 50A is formed between the first electrode 10A and the second electrode 10B, a second space 50B is formed between the second electrode 10B and the third electrode 10C, and a third space SOC is formed between the third electrode 10C and the second electrode 10D.

When depositing a film on a surface of a processing object 90 using the plasma CVD apparatus equipped with the plasma source 1 having the above-mentioned configuration, first, an AC voltage is applied to each electrode 10A-10D from the AC power supply 30 through the wirings 40 and 42. Additionally, a gas for plasma is supplied in the vicinity of the electrode group 10.

Thereby, a polarity at each electrode 10A-10D changes periodically. Accordingly, for example, a discharge occurs with the first electrode 10A and the second electrode 10B serving as an electrode pair, which generates plasma in the vicinity of both electrodes. Additionally, a discharge occurs with the second electrode 10B and the third electrode 10C serving as an electrode pair, which generates plasma in the vicinity of both electrodes. Further, a discharge occurs with the third electrode 10C and the fourth electrode 10D serving as an electrode pair, which generates plasma in the vicinity of both electrodes.

Next, a source gas for film deposition is supplied to the first space 50A through the third space 50C. The supplied source gas is activated by the plasma generated in the vicinity of each electrode 10A-10D. Thus, a chemical reaction occurs in the source gas in the vicinity of the processing object 90, and, thereby, a film is deposited on the surface of the processing object 90.

As mentioned above, a desired film can be deposited on the surface of the processing object 90.

Here, a more detailed description is given, with reference to FIG. 2, of a periodical polarity change of each electrode 10A-10D constituting the electrode group 10 in a case where the conventional plasma source 1 is used.

FIG. 2 is a schematic diagram illustrating a polarity change of each electrode 10A-10D at a certain time by associating with a plasma density. Note that it is assumed that a temporal change of the output voltage V of the AC power supply 30 is represented by a sine wave of a period T as in FIG. 3.

In the configuration of the conventional plasma source 1, each of the first electrode 10A and the third electrode 10C is connected the wiring 40. Accordingly, when an AC voltage is applied from the AC power supply 30, the first electrode 10A and the third electrode 10C are in the same phase. Additionally, each of the second electrode 10B and the fourth electrode 10D is connected to the wiring 42. Accordingly, the second electrode 10B and fourth electrode 10D are in the same phase.

On the other hand, the AC voltages supplied to the wiring 40 and the wiring 42 are shifted in their phase by a ½ period. Accordingly, voltages of opposite polarities of positive and negative are applied to the first and third electrodes 10A and 10C and the second and fourth electrodes 10B and 10D.

Figure 3:
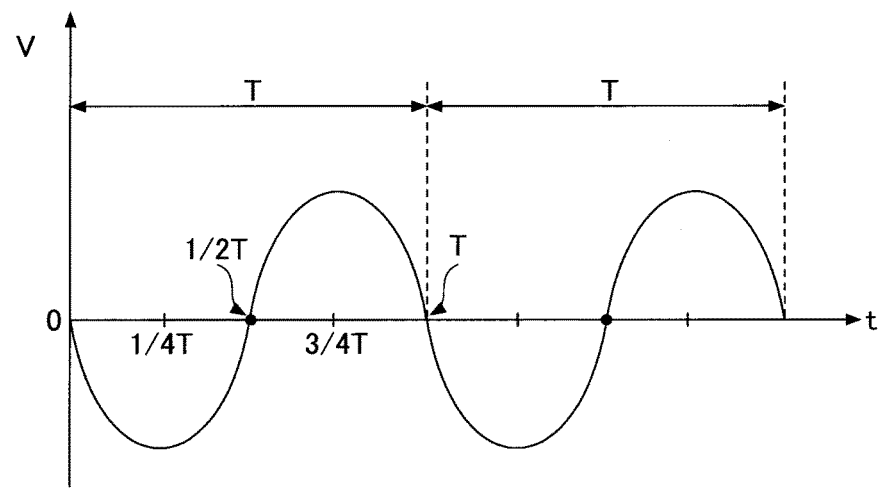
FIG. 3 is a chart schematically illustrating a temporal change of an output voltage V of an AC power supply.

From above, the polarities illustrated in FIG. 2(a) are obtained at each electrode 10A-10D at time t=¼T (refer to FIG. 3). That is, the polarity of each electrode 10A-10D is negative-positive-negative-positive sequentially from the first electrode 10A.

In this case, the flow of electrons due to the discharge is such as indicated by three arrows F1-F3 of FIG. 2(a). That is, a large part of electrons discharged from the first electrode 10A is taken in, as indicated by the arrow F1, by the adjacent second electrode 10B. Thereby, first plasma 60A of a large plasma density is generated between the first electrode 10A and the second electrode 10B (hereinafter, such plasma is referred to as the "high-density plasma").

Additionally, the reactivity of the source gas passing through the first space 50A is raised because the source gas is exposed to the high-density plasma 60A.

On the other hand, a part of electrons from the third electrode 10C is, as indicated by the arrows F2 and F3, taken in by the second electrode 10B, and the remaining part is taken in by the fourth electrode 10D. Thereby, second plasma 60B is generated between the second electrode 10B and the third electrode 10C, and third plasma 60C is generated between the third electrode 10C and the fourth electrode 10D. However, because the electrons from the third electrode 10C are dispersed into the two electrodes of the positive polarity, the second plasma 60B and third plasma 60C do not have a high density such as the first plasma 60A, and are low-density plasma (hereinafter, such plasma is referred to as the "low-density plasma").

Accordingly, because the source gas passing through the second space 50B and the third space 50C is caused to be exposed to the low-density plasma 60B, 60C, the reactivity of the source gas is greatly reduced as compared to the source gas passing through the first space 50A.

Next, at time t=¾T, the polarities such as FIG. 2(b) are obtained at each electrode 10A-10D. That is, the polarity of each electrode 10A-10D is positive-negative-positive-negative sequentially from the first electrode 10A.

In this case, the flow of electrons is such as indicated by three arrows F4-F6 of FIG. 2(b). That is, a large part of electrons discharged from the fourth electrode 10D is taken in, as indicated by the arrow F6, by the adjacent third electrode 10C. Accordingly, the "high-density plasma" 60C is generated between the third electrode 10C and the fourth electrode 10D.

Additionally, the reactivity of the source gas passing through the third space 50C is raised because the source gas is exposed to the high-density plasma 60C.

However, a part of electrons from the second electrode 10B is, as indicated by the arrows F4 and F5, taken in by the first electrode 10A, and the remaining part is taken in by the third electrode 10C. Thereby, the first plasma 60A is generated between the first electrode 10A and the second electrode 10B, and the second plasma 60B is generated between the second electrode 10B and the third electrode 10C. However, because the electrons from the second electrode 10B are dispersed into the two electrodes of the positive polarity, each of the first plasma 60A and second plasma 60B are "low-density plasma".

Accordingly, because the source gas passing through the first space 50A and the second space 50B is caused to be exposed to the low-density plasma 60A, 60B, the reactivity of the source gas is greatly reduced as compared to the source gas passing through the third space 50C.

Figure 4:
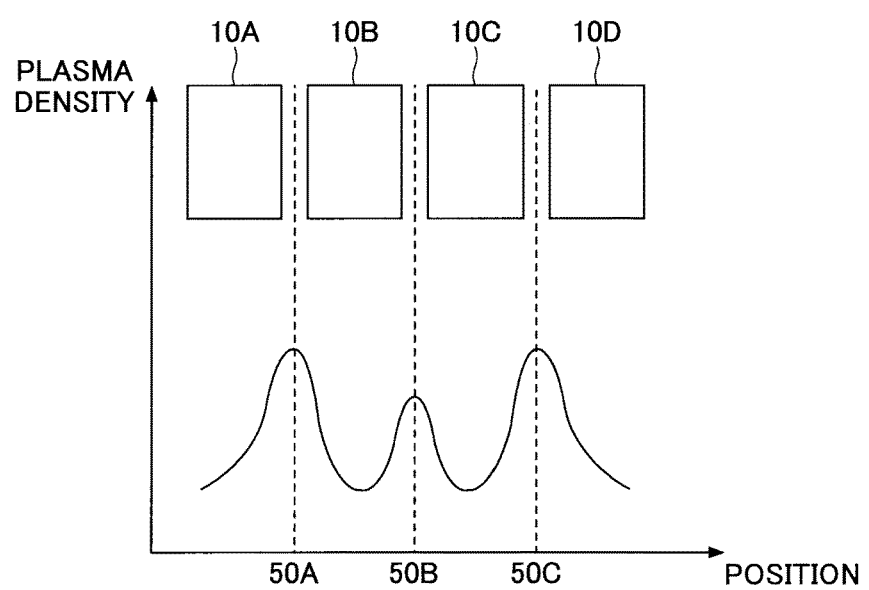
FIG. 4 is a chart roughly illustrating a total density of plasma generated in a reaction area during a period T when using the conventional plasma source.

From the above-mentioned results, the total density of plasma generated in the reaction area (above the surface of the processing object 90/directly under the electrode group 10) during one period T is roughly represented as FIG. 4.

Note that, in FIG. 4, the horizontal axis corresponds to a horizontal position of each space 50A-50C (and each electrode 10A-10D). Additionally, the vertical axis represents the total density of the plasma generated in the reaction area during one period T.

Because the plasma density during one period T is a large factor that determines the reaction rate of the source gas and further the deposition rate of the film, it is desirable to raise the plasma density of the reaction area as high as possible.

However, from FIG. 4, it is difficult to say that the plasma density of the reaction area is raised sufficiently, and it is appreciated that a further improvement in the plasma density is necessary.

Note that, according to a trial calculation, it is estimated that the plasma density in the reaction area on the downstream side of the second space 50B is, for example, about ⅔ of the plasma density in the reaction area of the downstream side of the first space 50A and the third space 50C.

As mentioned above, it is desired to make a further improvement with respect to the conventional plasma source 1 from a view point of improving the reaction rate of the source gas and improving the deposition rate of the film.

(Regarding a Plasma Source of a Plasma CVD Apparatus According to an Embodiment of the Present Invention)

Next, a description is given, with reference to FIG. 5 and FIG. 6, of a feature of a plasma source for a plasma CVD apparatus according to an embodiment of the present invention (hereinafter referred to as the "first plasma source").

Figure 5:
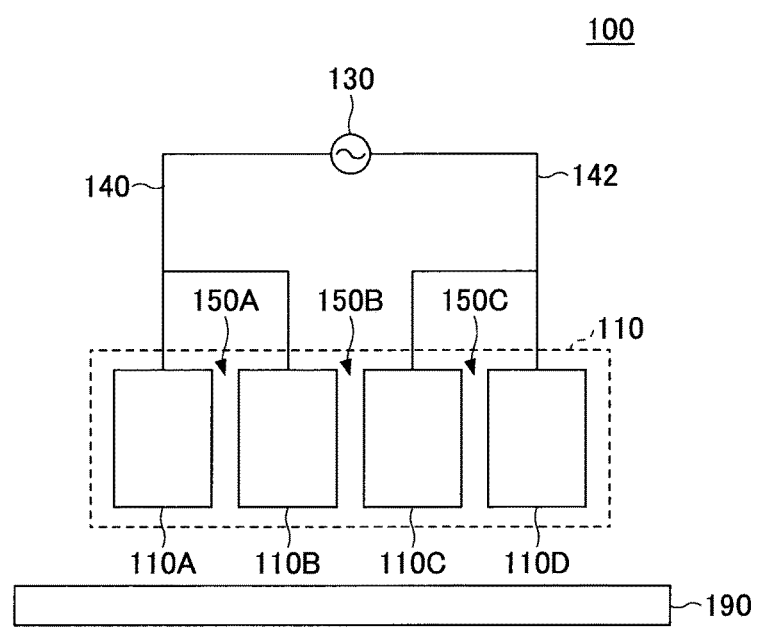
FIG. 5 is a diagram roughly illustrating a configuration example of a first plasma source for a plasma CVD apparatus according to an embodiment of the present invention.

FIG. 5 is an illustration illustrating a configuration of the first plasma source of the present invention. Additionally, FIG. 6 is a schematic diagram illustrating a polarity change of each electrode at a certain time in the first plasma source of the present invention by associating with a density of plasma.

The conventional plasma source 1 and the plasma source 100 of the present invention for a plasma CVD apparatus are different in each electrode 110A-110D constituting an electrode group and a connecting method with an AC power supply 130.

That is, as illustrated in FIG. 5, the AC power supply 130 has a wiring 140 for a first polarity and a wiring 142 for a second polarity opposite to the first polarity, and the wiring 140 for the first polarity is connected to the first electrode 110A and the second electrode 110B. Additionally, the wiring 142 for the second electrode is connected to the third electrode 110C and the fourth electrode 110D.

Note that the frequency of the AC power supply 130 is, for example, in a range of 5 kHz-500 kHz.

Additionally, in the plasma source 100 of the present invention for a plasma CVD apparatus, plasma can be formed over a dimension of, for example, 0.5 m or longer along the arranging direction of the electrodes 110A-110D.

Next, a description is given of an operation of the first plasma source 100.

When depositing a film on a surface of a processing object 190 by using the first plasma source 100 as illustrated in FIG. 5, first, an AC voltage is applied from the AC power supply 130 to each electrode 110A-110D through the wirings 140 and 142. Additionally, a gas for plasma is supplied to the vicinity of the electrode group 110.

Thereby, the polarity at each electrode 110A-110D periodically changes, and plasma is generated directly under the electrode group 110 due to discharges between the electrodes 110A-110D.

Next, a source gas for film deposition is supplied to a first space 150A through a third space 150C. Note that, in the present application, "(n-th) space" means a portion formed between adjacent electrodes among passages for causing the source gas to flow toward the reaction area.

The supplied source gas is activated by the plasma generated in the vicinity of each electrode 110A-110D. Thus, a chemical reaction occurs in the source gas in the vicinity of the processing object 190, and, thereby, a film can be deposited on the surface of the processing object 190.

Note that, in the example of FIG. 5, the first plasma source 100 includes the single AC power supply 130. However, the configuration of the present invention is not limited to this, and the first plasma source 100 may be equipped with a plurality of AC power supplies. For example, in the case of the configuration of FIG. 5, two AC power supplies 130-1 and 130-2 may be present, and the first AC power supply 130-1 may be connected to the first electrode 110A and the third electrode 110C and the second AC power supply 130-2 may be connected to the second electrode 110B and the fourth electrode 110D. In this case, the two AC power supplies 130-1 and 130-2 are arranged so that voltages applied to the first electrode 110A and the second electrode 110B are in the same phase and voltages applied to the third electrode 110A and the fourth electrode 110D are in the same phase.

Figure 6:
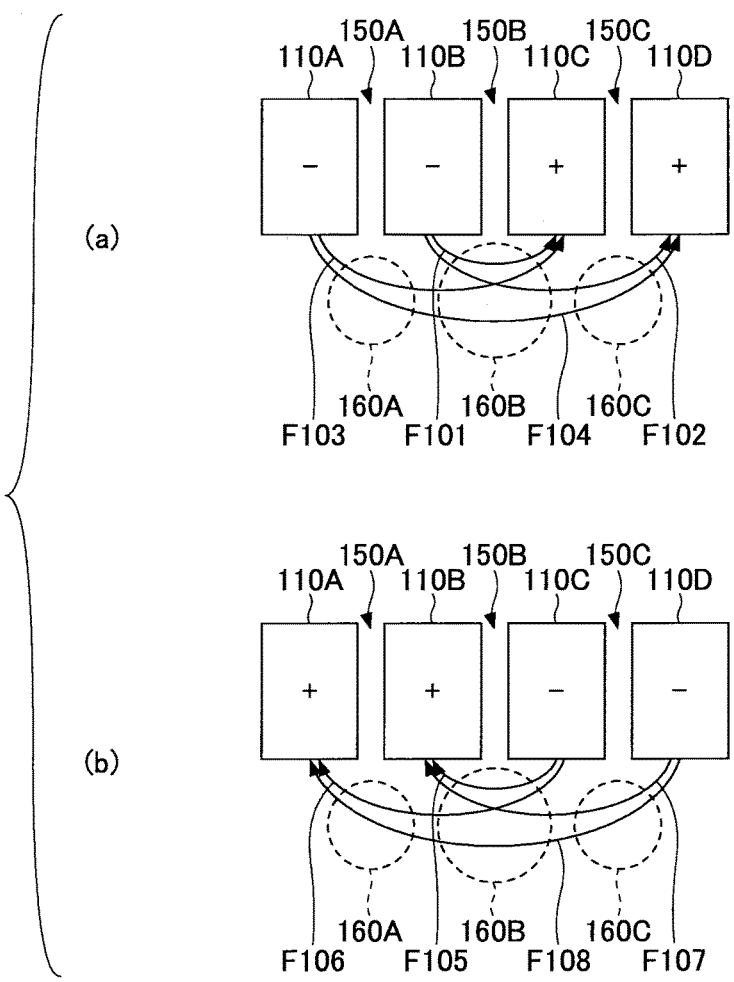
FIGS. 6(a)-(b) are diagrams illustrating a polarity change of each electrode at a certain time in the first plasma source by associating with a density of plasma.

Here, a more specific description is given, with reference to FIG. 6, of the periodical polarity change of each electrode 110A-110D constituting the electrode group 110.

FIG. 6 is a schematic diagram illustrating a polarity change of each electrode 110A-110D at a certain time by associating with a density of plasma. Note that it is assumed that the temporal change of the output voltage V of the AC power supply 130 is represented by a sine wave of a period T like the above-mentioned FIG. 3.

In the first plasma source 100 of the present invention, each of the first electrode 110A and the second electrode 110B is connected to the wiring 140 for the first polarity. Thus, when an AC voltage is applied from the AC power supply 130, the first electrode 110A and the second electrode 110B are in the same phase. Additionally, wach of the third electrode 110A and the fourth electrode 110D is connected to the wiring 142 of the second polarity. Thus, the third electrode 110C and the fourth electrode 110D are also in the same phase.

On the other hand, the AC voltages supplied to the wiring 140 for the first polarity and the wiring 142 for the second polarity are shifted in their phase from each other by a ½ period. Thus, voltages of opposite polarities of positive/negative are applied to the first and second electrodes 110A and 110B and the third and fourth electrodes 110C and 110D, respectively.

From the above explanation, polarities such as FIG. 6(*a*) are obtained at each electrode 110A-110D at time t=¼T (refer to FIG. 3). That is, the polarity of each electrode 110A-110D is negative-negative-positive-positive sequentially from the first electrode 110A side.

In this case, the flow of electrons due to the discharge is such as indicated by four arrows F101-F104 of FIG. 6(*a*). That is, a prat of electrons from the second electrode 110B is taken in, as indicated by the arrow F101, by the adjacent third electrode 110C, and the other part is taken in, as indicated by the arrow F102, by the fourth electrode 110D.

Note that the reason for the part of electrons from the second electrode 110B reaching the fourth electrode 110D by passing over the third electrode 110C is that the third electrode 110C and the fourth electrode 110D are equal in their polarity (either is the positive polarity) and there is no electrode of the opposite polarity between the third electrode 110C and the fourth electrode 110D. (However, due to a relationship of distances between the electrodes, it is considered that a large part of electrons emitted from the second electrode 110B is taken in by the third electrode 110C, and a ratio of electrons traveling to the fourth electrode 110D is smaller than a ratio of electrons taken in by the third electrode 110C.)

Similarly, a prat of electrons from the first electrode 110A is taken in, as indicated by the arrow F103, by the third electrode 110C, and the other part is taken in, as indicated by the arrow F104, by the fourth electrode 110D.

Note that the reason for the part of electrons from the first electrode 110A reaching the fourth electrode 110D by passing over the third electrode 110C is that the third electrode 110C and the fourth electrode 110D are equal in their polarity (either is the positive polarity) and there is no electrode of the opposite polarity between the third electrode 110C and the fourth electrode 110D. (However, due to a relationship of distances between the electrodes, it is considered that a large part of electrons emitted from the first electrode 110A is taken in by the third electrode 110C, and a ratio of electrons traveling to the fourth electrode 110D is smaller than a ratio of electrons taken in by the third electrode 110C.)

From the above-mentioned results, "high-density plasma" 160A is generated as the first plasma 160A between the first electrode 110A and the second electrode 110B at time t=¼T. Additionally, the second plasma having an extremely large plasma density is generated between the second electrode 110B and the third electrode 110C (hereinafter, such plasma is referred to as the "ultra-high-density plasma"). Further, "high-density plasma" is generated as the third plasma 160C between the third electrode 110C and the fourth electrode 110D.

Next, polarities such as FIG. 6(*b*) are obtained at each electrode 110A-110D at time t=¾T. That is, the polarity of each electrode 110A-110D is positive-positive-negative-negative sequentially from the first electrode 110A side.

In this case, the flow of electrons is such as indicated by four arrows F105-F108 of FIG. 6(*b*). That is, a part of electrons from the third electrode 110C is taken in, as indicated by the arrow F105, by the adjacent second electrode 110B, and the other part is taken in, as indicated by the arrow F106, by the first electrode 110A.

Note that the reason for the part of electrons from the third electrode 110C reaching the first electrode 110A by passing over the second electrode 110B is that the first electrode 110A and the second electrode 110B are equal in their polarity (either is the positive polarity) and there is no electrode of the opposite polarity between the first electrode 110A and the second electrode 110B. (However, due to a relationship of distances between the electrodes, it is considered that a large part of electrons emitted from the third electrode 110C is taken in by the second electrode 110B, and a ratio of electrons traveling to the first electrode 110A is smaller than a ratio of electrons taken in by the second electrode 110B.)

Similarly, a prat of electrons from the fourth electrode 110D is taken in, as indicated by the arrow F107, by the second electrode 110B, and the other part is taken in, as indicated by the arrow F108, by the first electrode 110A.

Note that the reason for the part of electrons from the fourth electrode 110D reaching the first electrode 110D by passing over the second electrode 110B is that the first electrode 110A and the second electrode 110B are equal in their polarity (either is the positive polarity) and there is no electrode of the opposite polarity between the first electrode 110A and the second electrode 110B. (However, due to a relationship of distances between the electrodes, it is considered that a large part of electrons emitted from the fourth electrode 110D is taken in by the second electrode 110B, and a ratio of electrons traveling to the first electrode 110A is smaller than a ratio of electrons taken in by the second electrode 110B.)

From the above-mentioned results, the "high-density plasma" 160A is generated as the first plasma 160A between the first electrode 110A and the second electrode 110B at time t=¾T. Additionally, the "ultra-high-density plasma" as the second plasma 160B is generated between the second electrode 110S and the third electrode 110C. Further, the "high-density plasma" is generated as the third plasma 160C between the third electrode 110C and the fourth electrode 110D.

Figure 7:
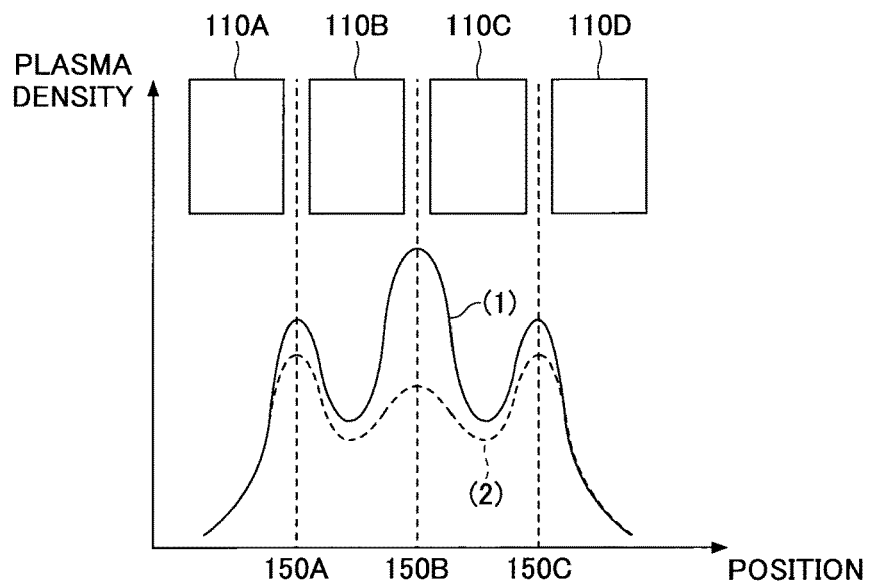
FIG. 7 is a chart roughly illustrating the total density of plasma generated in the reaction area during the period T when using the first plasma source in comparison with a case of the conventional plasma source.

As a result, in the first plasma source 100, a total density of plasma generated in the reaction area (above the surface of the processing object 90/directly under the electrode group) during one period T is roughly illustrated as a curve (1) of FIG. 7.

Note that, in FIG. 7, the horizontal axis represents a horizontal position of each space 150A-150C (and each electrode 110A-110D), and the vertical axis represents the total density of plasma generated in the reaction area during one period T. Additionally, in FIG. 7, a similar curve (curve (2)) of a plasma density in the conventional plasma source 1, which is illustrated in the above-mentioned FIG. 4, is illustrated simultaneously.

It can be appreciated from FIG. 7 that the plasma density (curve (1)) of the plasma foLmed in the first plasma source 100 is significantly improved in its entirety as compared to the plasma density (curve (2)) of the plasma formed in the conventional plasma source 1.

Particularly, according to a trial calculation, when the first plasma source 100 is used, it is expected that the density of plasma in the vicinity of the center of the reaction area (downstream side of the second space 150B) during one period is increased to about twice the plasma density at the same position in the conventional plasma source 1. Additionally, when using the first plasma source 100, it is expected that the density of plasma during one period is increased to, for example, about 1.5 times the plasma density at the same position in the conventional plasma source 1 also on the downstream side of the first space 150A and the third space 150C in the reaction area.

In this way, when using the first plasma source 100, the reactivity of the source gas supplied to the first space 150A through the third space 150C is improved, which enables significantly increasing the film deposition rate.

A characteristic effect of the present invention has been explained in the above using the first plasma source 100 having the configuration illustrated in FIG. 5 as an example. However, the configuration of the plasma source according to the present invention is not limited to the configuration illustrated in FIG. 5.

That is, in more generalized description, it is necessary to pay attention to the point that the above-mentioned effect of the present invention is equally achieved when "at least one set of adjacent electrodes are in the same phase during one period T" in a series of electrodes constituting the electrode group. For example, in the case of the first plasma source 100 illustrated in FIG. 5, the first electrode 110A and the adjacent second electrode 110B are always in the same phase. Additionally, the third electrode 110C and the adjacent fourth electrode 110D are always in the same phase.

In the present invention, the configuration of the plasma source is not limited in particular as long as the condition that "voltages applied to at least one adjacent electrode set are in the same phase" is satisfied. For example, the number of electrodes constituting the electrode group may be any number equal to or greater than 4, and the number of electrodes may be, for example, 6, 8 or 10.

Additionally, although, in the example of FIG. 5, the arranging direction of the electrodes 110A-110D constituting the electrode group 110 is parallel to the surface of the processing object 190, the arranging direction is not limited in particular in the present invention. Further, in the example of FIG. 5, the first through third spaces 150A-150C extend in a direction perpendicular to the arranging direction of the electrodes 110A-110D constituting the electrode group 110. However, the extending direction of the spaces 150A-150C is not limited to this. For example, the extending direction of the space for the supply path of the source gas may be inclined with respect to the arranging direction of the electrodes at an angle other than a right angle.

(Manufacturing Method of an Article Using the First Plasma Source According to the Present Invention)

Here, a description is given of a manufacturing method of an article using the first plasma source according to the present invention.

First, the processing object 190 is arranged in a plasma CVD apparatus equipped with the first plasma source. Then, a source gas for film deposition is supplied from each space between the electrodes 110A-110D. Then, a negative voltage is applied to the first electrode 110A and the second electrode 110B, and a positive voltage is applied to the third electrode 110C and the fourth electrode 110D. Then, after passage of a predetermined time, a positive voltage is applied to the first electrode 110A and the second electrode 110B, and a negative voltage is applied to the third electrode 110C and the fourth electrode 110D. By repeating these operations, a film deposition is applied onto the processing object 190 to manufacture an article.

(Second Plasma Source According to the Present Invention)

Figure 8:
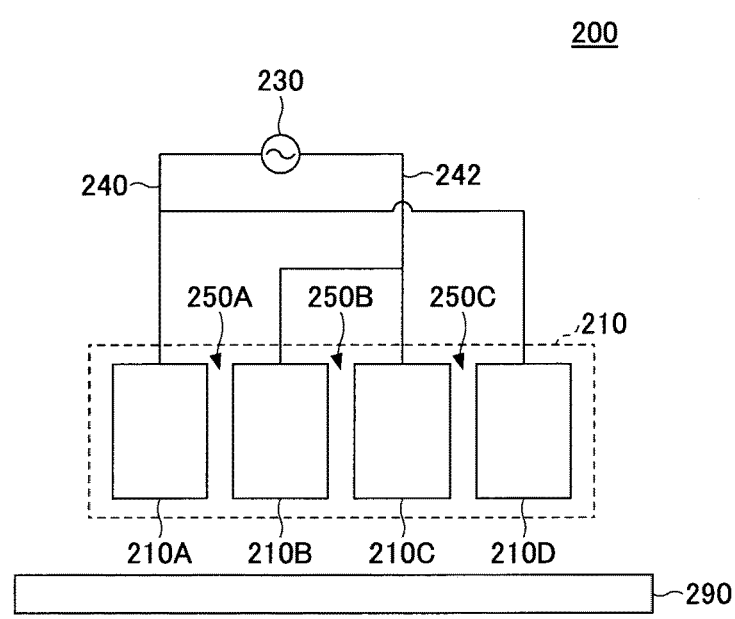
FIG. 8 is a diagram roughly illustrating a configuration example of a second plasma source for the plasma CVD apparatus according to the embodiment of the present invention.

Next, a description is given, with reference to FIG. 8, of another configuration example (second plasma source) according to the present invention.

FIG. 8 schematically illustrates the configuration of the second plasma source according to the present invention.

As illustrated in FIG. 8, basically the second plasma source 200 of the present invention has the same configuration as the first plasma source 100 illustrated in FIG. 5. Accordingly, in FIG. 8, parts that are the same as the parts of FIG. 5 are given reference numbers that are obtained by adding 100 to the reference numbers used in FIG. 5, respectively.

However, the second plasma source 200 differs from the first plasma source 100 in the connecting method of an AC power supply 230.

That is, as illustrated in FIG. 8, in the second plasma source 200, the AC power supply 230 has a wiring 240 for a first polarity and a wiring 242 for a second polarity opposite to the first polarity, and the first wiring 240 is connected to a first electrode 210A and a fourth electrode 210A. Additionally, the second wiring 242 for the second polarity is connected to a second electrode 210B and a third electrode 210C.

Note that, in the example of FIG. 8, the second plasma source 200 has the single AC power supply 230. However, the configuration of the present invention is not limited to this, and the second plasma source 200 may be equipped with a plurality of AC power supplies. For example, in the case of the configuration of FIG. 8, two AC power supplies 230-1 and 230-2 may be present, and the first AC power supply 230-1 may be connected to the first electrode 210A and the second electrode 210B and the second AC power supply 230-2 may be connected to the fourth electrode 210D and the third electrode 210C. In this case, the two AC power supplies 230-1 and 230-2 are arranged so that voltages applied to the first electrode 210A and the fourth electrode 210D are in the same phase and voltages applied to the second electrode 210B and the third electrode 210C are in the same phase.

Figure 9:
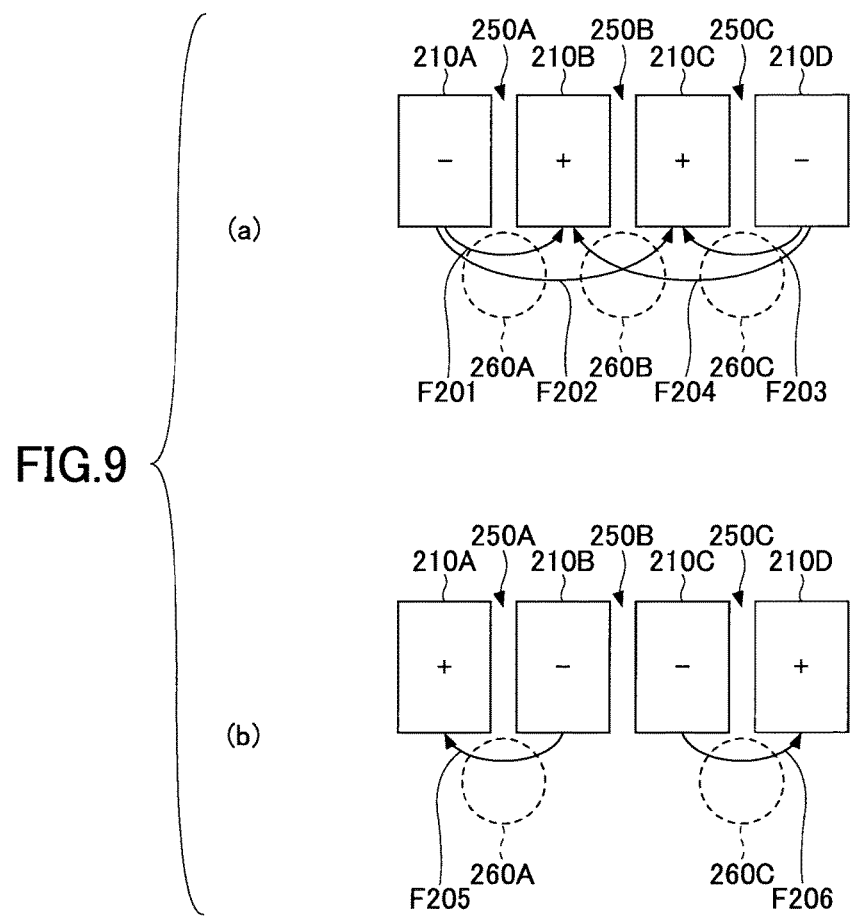
FIGS. 9(a)-(b) are diagrams illustrating a polarity change of each electrode at a certain time in the second plasma source by associating with a density of plasma.

Next, a more detailed description is given, with reference to FIG. 9, of a periodical polarity change of each electrode 210A-210D constituting an electrode group 210 when the second plasma source 200 according to the present invention is used.

FIG. 9 is a schematic diagram illustrating a polarity change of each electrode 210A-210D at a certain time by associating with a density of plasma. Note that it is assumed that the temporal change of the output voltage V of the AC power supply 230 is represented by a sine wave of a period T like the above-mentioned FIG. 3.

In the second plasma source 200 of the present invention, each of the first electrode 210A and the fourth electrode 210D is connected to the wiring 240. Thus, when an AC voltage is applied from the AC power supply 230, the first electrode 210A and the fourth electrode 210D are in the same phase. Additionally, each of the second electrode 210B and the third electrode 210C is connected to the wiring 242. Thus, the second electrode 210B and the third electrode 210C are also in the same phase.

On the other hand, the AC voltages supplied to the wiring 240 and the wiring 242 are shifted in their phase from each other by a ½ period. Thus, voltages of opposite polarities of positive/negative are applied to the first and fourth electrodes 210A and 210D and the second and third electrodes 210B and 210C, respectively.

From the above-mentioned matter, polarities such as FIG. 9(a) are obtained at each electrode 210A-210D at time t=¼T (refer to FIG. 3). That is, the polarity of each electrode 210A-210D becomes negative-positive-positive-negative sequentially from the first electrode 210A side.

In this case, the flow of electrons due to the discharge is such as indicated by four arrows F201-F204 of FIG. 9(a). That is, a prat of electrons from the first electrode 210A is taken in by the adjacent second electrode 210B as indicated by the arrow F201, and the other part is taken in by the third electrode 210C as indicated by the arrow F202.

Note that the reason for the part of electrons from the first electrode 210A reaching the third electrode 210C by passing over the second electrode 210B is that the second electrode 210B and the third electrode 210C are equal in their polarity (either is the positive polarity) and there is no electrode of the opposite polarity between the second electrode 210B and the third electrode 210C. (However, due to a relationship of distances between the electrodes, it is considered that a large part of electrons emitted from the first electrode 210A is taken in by the second electrode 210B, and a ratio of electrons traveling to the third electrode 210C is smaller than a ratio of electrons taken in by the second electrode 210B.)

Similarly, a prat of electrons from the fourth electrode 210D is taken in by the adjacent third electrode 210C as indicated by the arrow F203, and the other part is taken in by the second electrode 210B as indicated by the arrow F204.

Note that the reason for the part of electrons from the fourth electrode 210D reaching the second electrode 210B by passing over the third electrode 210C is that the second electrode 210B and the third electrode 210C are equal in their polarity (either is the positive polarity) and there is no electrode of the opposite polarity between the second electrode 210B and the third electrode 210C. (However, due to a relationship of distances between the electrodes, it is considered that a large part of electrons emitted from the fourth electrode 210D is taken in by the third electrode 210C, and a ratio of electrons traveling to the second electrode 210B is smaller than a ratio of electrons taken in by the third electrode 210C.)

From the above-mentioned results, the "high-density plasma" 260A is generated as the first plasma 260A between the first electrode 210A and the second electrode 210B at time t=¼T. Additionally, the "high-density plasma" 260B as the second plasma 260B is generated between the second electrode 210B and the third electrode 2100. Further, the "high-density plasma" 260C as the third plasma 260C is generated between the third electrode 210C and the fourth electrode 210D.

Next, polarities such as FIG. 9(b) are obtained at each electrode 210A-210D at time t=¾T. That is, the polarity of each electrode 210A-210D becomes positive-negative-negative-positive sequentially from the first electrode 210A side.

In this case, the flow of electrons is such as indicated by two arrows F205-F206 of FIG. 9(b). That is, the electrons from the second electrode 210B are taken in by the adjacent first electrode 210A as indicated by the arrow F205. Similarly, the electrons from the third electrode 210C are taken in by the fourth electrode 210D as indicated by the arrow F206.

From the above-mentioned results, the "high-density plasma" 260A is generated as the first plasma 260A between the first electrode 210A and the second electrode 210B at time t=¾T. Additionally, plasma is hardly generated between the second electrode 210B and the third electrode 210C. On the other hand, the "high-density plasma" 260C is generated as the third plasma 260C between the third electrode 210C and the fourth electrode 210D.

Note that the set of the second electrode 210B and the third electrode 210A satisfies the condition that "voltages applied to adjacent electrodes are in the same phase" at either of time t=¼T and time t=¾T.

Figure 10:
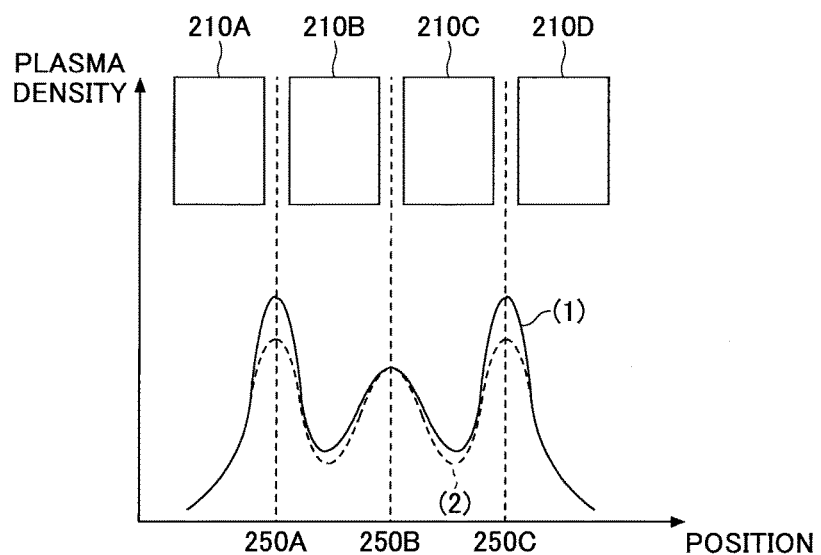
FIG. 10 is a chart roughly illustrating the total density of plasma generated in the reaction area during the period T when using the second plasma source in comparison with the case of the conventional plasma source.

In this second plasma source 200, a total density of plasma generated in the reaction area (above the surface of the processing object 90/directly under the electrode group 210) is roughly illustrated as a curve (1) of FIG. 10.

Note that, in FIG. 10, the horizontal axis represents a horizontal position of each space 250A-250C (and each electrode 210A-210D), and the vertical axis represents the total density of plasma generated in the reaction area during one period T. Additionally, in FIG. 10, a similar curve (curve (2)) of a plasma density in the conventional plasma source 1, which is illustrated in the above-mentioned FIG. 4, is illustrated simultaneously.

It can be appreciated from FIG. 10 that the density of plasma (curve (1)) formed in the second plasma source 200 is significantly improved as compared to the density of plasma (curve (2)) famed in the conventional plasma source 1.

Particularly, according to a trial calculation, when the second plasma source 200 is used, it is expected that the density of plasma in the reaction area on the downstream side of the first space 250A and the third space 250C during one period is increased to about 1.5 times the plasma density at the same position in the conventional plasma source 1.

In this way, also when using the second plasma source 200, the reactivity of the source gas supplied to the first space 250A through the third space 250C is improved, which enables significantly increasing the film deposition rate.

(Manufacturing Method of an Article Using the Second Plasma Source According to the Present Invention)

Here, a description is given of a manufacturing method of an article using the second plasma source according to the present invention.

First, the processing object 290 is arranged in a plasma CVD apparatus equipped with the second plasma source. Then, a source gas for film deposition is supplied from each electrode interval of the electrodes 210A-210D. Then, a negative voltage is applied to the first electrode 210A and the fourth electrode 210D, and a positive voltage is applied to the second electrode 210B and the third electrode 210C. Then, after passage of a predetermined time, a positive voltage is applied to the first electrode 210A and the fourth electrode 210D, and a negative voltage is applied to the second electrode 210B and the third electrode 210C. By repeating these operations, a film deposition is applied onto the processing object 290 to manufacture an article.

(Third Plasma Source According to the Present Invention)

Figure 11:
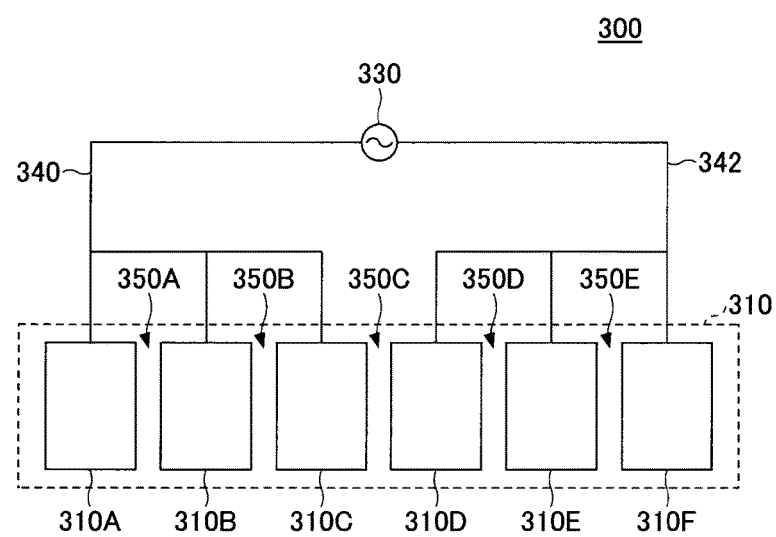
FIG. 11 is a diagram roughly illustrating a configuration example of a third plasma source for the plasma CVD apparatus according to the embodiment of the present invention.

Next, a description is given, with reference to FIG. 11, of another configuration example (third plasma source) according to the present invention.

FIG. 11 schematically illustrates the configuration of the third plasma source according to the present invention.

As illustrated in FIG. 11, basically the third plasma source 300 of the present invention has the same configuration as the first plasma source 100 illustrated in FIG. 5. Accordingly, in FIG. 11, parts that are the same as the parts of FIG. 5 are given reference numbers that are obtained by adding 100 to the reference numbers used in FIG. 5, respectively.

However, the third plasma source 300 differs from the first plasma source 100 in that the number of electrodes constituting an electrode group 310 is increased to 6.

Additionally, with this, an AC power supply 330 has a wiring 340 for a first polarity and a wiring 342 for a second polarity opposite to the first polarity, and the wiring 340 for the first polarity is connected to a first electrode 310A, a second electrode 310B and a third electrode 310C. Additionally, the wiring 342 for the second polarity is connected to a fourth electrode 310D, a fifth electrode 310E and a sixth electrode 310F.

In the third plasma source 300 having the above-mentioned configuration, each of the first electrode 310A, the second electrode 310B and the third electrode 310C is connected to the wiring 340. Thus, when an AC voltage is applied from the AC power supply 330, the first electrode 310A, the second electrode 310B and the third electrode 310C are in the same phase. Additionally, each of the fourth electrode 310D, the fifth electrode 310E and the sixth electrode 310F is connected to the wiring 342. Thus, the fourth electrode 310D, the fifth electrode 310E and the sixth electrode 310F are also in the same phase.

On the other hand, the AC voltages supplied to the wiring 340 and the wiring 342 are shifted in their phase from each other by a ½ period. Thus, voltages of opposite polarities of positive/negative are applied to the set of the first through third electrodes 310A-310C and the set of the fourth through sixth electrodes 310D-310F, respectively.

As a result, the polarity of each electrode 310A-310F at time t=¼T (refer to FIG. 3) is negative-negative-negative-positive-positive-positive sequentially from the first electrode 310A side. Additionally, the polarity of each electrode 310A-310F at time t=¾T is positive-positive-positive-negative-negative-negative sequentially from the first electrode 310A side.

In this case, each of the set of the first electrode 310A and the second electrode 310B, the set of the second electrode 310B and the third electrode 310C, the set of the fourth electrode 310D and the fifth electrode 310E, and the set of the fifth electrode 310E and the sixth electrode 310F satisfies the condition that "adjacent electrodes are in the same phase".

Accordingly, also in the third plasma source 300, an effect the same as the first plasma source 100, that is, the effect that the reactivity of the source gas supplied to each space 350A-350E is improved and the film deposition rate is significantly increased can be obtained.

(Regarding Specific Configuration Example of a Plasma Source According to an Embodiment of the Present Invention)

Figure 12:
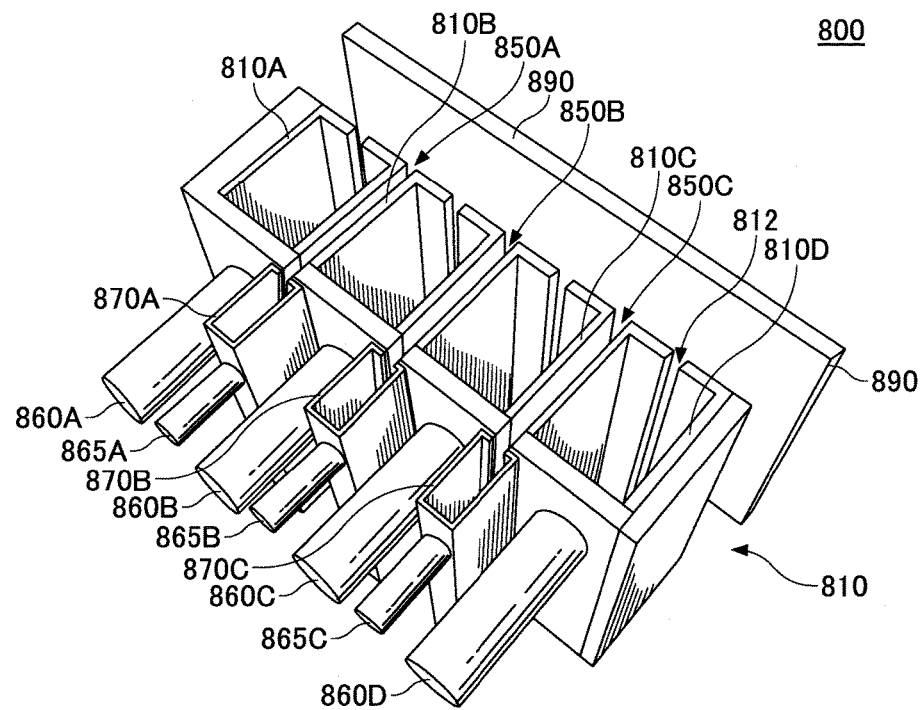
FIG. 12 is a view roughly illustrating a configuration example of a plasma source apparatus.

Next, a description is given, with reference to FIG. 12, of a specific configuration example of an apparatus (plasma source apparatus) equipped with a plasma source according to an embodiment of the preset invention. Note that a description is given here of a specific configuration of the plasma source apparatus by a plasma source having the above-mentioned concept illustrated in FIG. 5 as an example.

FIG. 12 illustrates a plasma source apparatus 800. The plasma source apparatus 800 is equipped with an electrode group 810 and an AC power supply (not illustrated in the figure).

The electrode group 810 is constituted by four hollow electrodes 810A-810D. Each hollow electrode 810A-810D is connected with the AC power supply via a wiring for a first polarity (not illustrated in the figure) and a wiring for a second polarity (not illustrated in the figure) of the AC power supply.

Here, similar to the above-mentioned configuration illustrated in FIG. 5, the wiring for the first polarity is connected to the first hollow electrode 810A and the second hollow electrode 810B, and the wiring for the second polarity is connected to the third hollow electrode 810C and the fourth hollow electrode 810D. Accordingly, voltages applied to the first hollow electrode 810A and the second hollow electrode 810B are in the same phase, and voltages applied to the third hollow electrode 810C and the fourth hollow electrode 810D are also in the same phase. On the other hand, a voltage of an opposite polarity of positive/negative is applied between the first and second hollow electrodes 810A and 810B and the third and fourth electrodes 810C and 810D.

Each hollow electrode 810A-810D has a slot 812 for injecting plasma. The slot of each hollow electrode has an elongated linear shape extending along a direction perpendicular to an arranging direction of the hollow electrodes 810A-810D. Although the slot 812 of each hollow electrode has a single slot 812 in the example of FIG. 12, a plurality of slots may be provided. Note that the slot 812 may be configured by one or two or more circular openings.

Intervals between the slots 812 of each hollow electrode are, for example, in a range of about 10 mm to about 200 mm.

A first space 850A having an end that opens toward a processing object 890 is formed between the adjacent first and second hollow electrodes 810A and 810B. Additionally, a second space 850B having an end that opens toward the processing object 890 is formed between the adjacent second and third hollow electrodes 810B and 810C. Similarly, a third space 850C having an end that opens toward the processing object 890 is formed between the adjacent third and fourth hollow electrodes 810C and 810D.

Moreover, the plasma source apparatus 800 is further equipped with first pipes 860 (860A-860D), second pipes 865 (865A-865C) and manifolds 870 (870A-870C).

The first pipes 860 are provided to supply a gas for generating plasma, such as, for example, argon gas, oxygen gas and/or nitrogen gas (referred to as the "reaction assist gas") necessary for a chemical reaction of a source gas, to a reaction area. The second pipes 865 and the manifolds 870 are provided to supply the source gas (that is, a precursor of a film deposition material) to the reaction area via the first through third spaces 850A-850C.

When depositing a film on the surface of the processing object 890 by using the plasma source apparatus 800 such as illustrated in FIG. 12, first, an AC voltage is applied to each electrode 810A-810D from the AC power supply. Additionally, a gas for plasma is supplied to the vicinity of each electrode 810A-810D.

Thereby, the polarity at each electrode 810A-810D is changed periodically, and plasm is generated in the reaction area due to discharges between the electrodes 810A-810D.

Next, a reaction assist gas is supplied to the reaction area through the first pipes 860A-860D. Additionally, the source gas is supplied to the reaction area through the second pipes 865A-865C and the manifolds 870A-870C and further the first through third spaces 850A-850C.

The source gas and the reaction assist gas supplied to the reaction area are activated by the plasma generated in the vicinity of each electrode 810A-810D. Thus, a chemical reaction occurs in the source gas in the vicinity of the processing object 890, and, thereby, a film is famed on the surface of the processing object 890.

It is apparent from the above recitation that the reactivity of the source gas supplied to each space 850A-850E is raised, which enables to obtain the effect that the film deposition rate of the film can be significantly raised.

Practical Example

A description is given below of practical examples of the present invention.

Practical Example 1

A film deposition of an SiO$_2$ thin film was performed using the above-mentioned plasma source 800 illustrated in FIG. 12.

Oxygen gas was used for the reaction assist gas. The reaction assist gas was controlled to be uniformly supplied to the four hollow electrodes 810A-810D. Tetramethyldisiloxane was used for the source gas. The source gas was controlled to be uniformly supplied to the spaces 850A-850C between the hollow electrodes 810A-810D.

The mixing ratio of these film deposition gases (oxygen/tetramethyldisiloxane) was set to 25. The flow rate of tetramethyldisiloxane relative to the length of the plasma source was set in five conditions, which are 200 sccm/m, 350 sccm/m, 500 sccm/m, 650 sccm/m, and 800 sccm/m. The open/close degree of the exhaust conductance valve was controlled so that the vacuum chamber pressure during the film deposition was 1.0 Pa in each condition of the flow rate of the film deposition gas.

The frequency of the AC power supply was 40 kHz, and an electric power was applied so that the electric power relative to the length of the plasma source was 80 kW/m. The wiring for the first polarity from the AC power supply was connected to the first hollow electrode 810A and the second hollow electrode 810B. Additionally, the wiring for the second electrode that is opposite to the first polarity was connected to the third hollow electrode 810C and the fourth hollow electrode 810D.

A soda-lime glass substrate of 300 mm length×300 mm width×2 mm thickness was used as the substrate. The substrate was not heated before the film deposition. Additionally, the conveyance speed of the substrate was set to 1.0 m/min.

Practical Example 2

A film deposition of an SiO$_2$ thin film was performed in the same manner as the practical example 1.

However, in the practical example 2, the wiring for the first polarity from the AC power supply was connected to the first hollow electrode 810A and the fourth hollow electrode 810D in the above-mentioned FIG. 12. Additionally, the wiring for the second polarity that is an opposite phase to the first polarity was connected to the second hollow electrode 810B and the third hollow electrode 810C. Other conditions were the same as the practical example 1.

Comparative Example 1

A film deposition of an SiO$_2$ thin film was perfolmed in the same manner as the practical example 1.

However, in the comparative example 1, the wiring for the first polarity from the AC power supply was connected to the first hollow electrode 810A and the third hollow electrode 810C in the above-mentioned FIG. 12. Additionally, the wiring for the second polarity that is an opposite phase to the first polarity was connected to the second hollow electrode 810B and the fourth hollow electrode 810D. Other conditions were the same as the practical example 1.

(Evaluation and Result)

A thickness measurement was performed on the SiO$_2$ thin film samples that are film-deposited in the practical examples 1 and 2 and the comparative example 1 by using a step film thickness meter (Dektak). The results of measurement are indicated in Table 1.

TABLE 1

| Source gas | Thickness of SiO$_2$ thin film (nm) | | |
|---|---|---|---|
| flow rate (sccm/m) | Practical Example 1 | Practical Example 2 | Comparative Example 1 |
| 200 | 198 | 198 | 199 |
| 350 | 309 | 296 | 288 |
| 500 | 376 | 354 | 332 |
| 650 | 421 | 382 | 352 |
| 800 | 458 | 398 | 363 |

A large difference in the film deposition rate between the practical examples 1 and 2 and the comparison example 1 was not found from Table 1. However, it was appreciated that the film deposition rate is improved in the practical examples 1 and 2 as compared to the comparison example 1. Especially, in the practical example, the film deposition rate was greatly improved with an increase in the source gas flow rate.

This is considered as follows from a reaction mechanism of a general CVD. When the source material flow rate is small and the chemical reaction of the source material existing in the reaction area has been sufficiently progressed, the film deposition rate is not improved even if the plasma density is increased. On the other hand, when the source material flow rate is large and the chemical reaction of the source material existing in the reaction area has not been sufficiently progressed, the film deposition rate is improved by increasing the plasma density.

It is apparent that the plasma density in the reaction area is increased from the fact that the film deposition rate is improved in the practical examples 1 and 2 as compared to the comparative example when the source material flow rate is large. Especially, it is said that the improvement effect of the plasma density is large in the practical example 1.

The present invention is not limited to the specifically disclosed embodiments using the above-mentioned plasma source as an example, and various variations and modifications may be made without departing from the scope of the present invention.

What is claimed is:

1. A method of manufacturing an article, comprising:
   positioning a processing object in a plasma CVD apparatus comprising a first electrode, a second electrode, a third electrode and a fourth electrode arrayed in a row in an order of the first, second, third and fourth electrodes;
   supplying a source gas for film deposition from at least one interval between adjacent electrodes of the first, second, third and fourth electrodes;
   conducting a first voltage applying process comprising applying a negative voltage to said first electrode and said second electrode adjacent to said first electrode, and applying a positive voltage to said third electrode and said fourth electrode adjacent to said third electrode; and
   conducting a second voltage applying process comprising applying a positive voltage to said first electrode and said second electrode and applying a negative voltage to said third electrode and said fourth electrode,
   wherein said first voltage applying process and said second voltage applying process are alternately conducted at every lapse of a predetermined time such that the film deposition is applied on the processing object.

2. A method of manufacturing an article according to claim 1, wherein the supplying of the source gas comprises supplying the sources gas from each interval between the adjacent electrodes of the first, second, third and fourth electrodes.

3. A method of manufacturing an article according to claim 2, wherein the supplying of the source gas comprises uniformly supplying the source gas to each interval between the adjacent electrodes of the first, second, third and fourth electrodes.

4. A method of manufacturing an article according to claim 3, wherein each of the first, second, third and fourth electrodes is a hollow electrode.

5. A method of manufacturing an article according to claim 4, further comprising:
   supplying a reaction assist gas to each of the first, second, third and fourth electrode.

6. A method of manufacturing an article according to claim 3, wherein each of the first, second, third and fourth electrodes is a hollow electrode having a slot configured to inject plasma.

7. A method of manufacturing an article according to claim 3, wherein each of the first, second, third and fourth electrodes is a hollow electrode having a slot configured to inject plasma such that the slot has an elongated linear shape extending along a direction perpendicular to a direction of the first, second, third and fourth electrodes arrayed in the row.

8. A method of manufacturing an article according to claim 1, wherein each of the first, second, third and fourth electrodes is a hollow electrode.

9. A method of manufacturing an article according to claim 1, wherein each of the first, second, third and fourth electrodes is a hollow electrode having a slot configured to inject plasma.

10. A method of manufacturing an article according to claim 1, wherein each of the first, second, third and fourth electrodes is a hollow electrode having a slot configured to inject plasma such that the slot has an elongated linear shape extending along a direction perpendicular to a direction of the first, second, third and fourth electrodes arrayed in the row.

11. A method of manufacturing an article, comprising:
    positioning a processing object in a plasma CVD apparatus comprising a first electrode, a second electrode, a third electrode and a fourth electrode arrayed in a row in an order of the first, second, third and fourth electrodes;
    supplying a source gas for film deposition from at least one interval between adjacent electrodes of the first, second, third and fourth electrodes;
    conducting a first voltage applying process comprising applying a negative voltage to said first electrode and said fourth electrode and applying a positive voltage to said second electrode and said third electrode; and
    conducting a second voltage applying process comprising applying a positive voltage to said first electrode and said fourth electrode and applying a negative voltage to said second electrode and said third electrode,
    wherein said first voltage applying process and said second voltage applying process are alternately conducted at every lapse of a predetermined time such that the film deposition is applied on the processing object.

12. A method of manufacturing an article according to claim 11, wherein the supplying of the source gas comprises supplying the sources gas from each interval between the adjacent electrodes of the first, second, third and fourth electrodes.

13. A method of manufacturing an article according to claim 12, wherein the supplying of the source gas comprises uniformly supplying the source gas to each interval between the adjacent electrodes of the first, second, third and fourth electrodes.

14. A method of manufacturing an article according to claim 13, wherein each of the first, second, third and fourth electrodes is a hollow electrode.

15. A method of manufacturing an article according to claim 14, further comprising:
    supplying a reaction assist gas to each of the first, second, third and fourth electrode.

16. A method of manufacturing an article according to claim 13, wherein each of the first, second, third and fourth electrodes is a hollow electrode having a slot configured to inject plasma.

17. A method of manufacturing an article according to claim 13, wherein each of the first, second, third and fourth electrodes is a hollow electrode having a slot configured to inject plasma such that the slot has an elongated linear shape extending along a direction perpendicular to a direction of the first, second, third and fourth electrodes arrayed in the row.

18. A method of manufacturing an article according to claim 11, wherein each of the first, second, third and fourth electrodes is a hollow electrode.

19. A method of manufacturing an article according to claim 11, wherein each of the first, second, third and fourth electrodes is a hollow electrode having a slot configured to inject plasma.

20. A method of manufacturing an article according to claim 11, wherein each of the first, second, third and fourth electrodes is a hollow electrode having a slot configured to inject plasma such that the slot has an elongated linear shape extending along a direction perpendicular to a direction of the first, second, third and fourth electrodes arrayed in the row.

* * * * *